United States Patent
Biswas et al.

(10) Patent No.: US 11,211,327 B2
(45) Date of Patent: Dec. 28, 2021

(54) VIA SIZING FOR IR DROP REDUCTION

(71) Applicant: Taiwan Semiconductor Manufacturing Company, Ltd., Hsinchu (TW)

(72) Inventors: Hiranmay Biswas, Hsinchu (TW); Chin-Shen Lin, Hsinchu (TW); Kuo-Nan Yang, Hsinchu (TW); Chung-Hsing Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 143 days.

(21) Appl. No.: 16/731,719

(22) Filed: Dec. 31, 2019

(65) Prior Publication Data
US 2020/0135643 A1 Apr. 30, 2020

Related U.S. Application Data

(62) Division of application No. 15/825,363, filed on Nov. 29, 2017, now Pat. No. 10,867,916.

(51) Int. Cl.
| | |
|---|---|
| *G06F 30/394* | (2020.01) |
| *H01L 23/528* | (2006.01) |
| *H01L 27/02* | (2006.01) |
| *H01L 27/118* | (2006.01) |
| *H01L 21/768* | (2006.01) |
| *H01L 23/522* | (2006.01) |

(52) U.S. Cl.
CPC ........ *H01L 23/5283* (2013.01); *G06F 30/394* (2020.01); *H01L 21/768* (2013.01); *H01L 27/0207* (2013.01); *H01L 27/11807* (2013.01); *H01L 23/5226* (2013.01); *H01L 2027/11875* (2013.01)

(58) Field of Classification Search
CPC .......................... G06F 30/394; H01L 23/5283
See application file for complete search history.

(56) References Cited

U.S. PATENT DOCUMENTS

| | | | | |
|---|---|---|---|---|
| 8,723,052 B1 * | 5/2014 | Sullivan | ............... | H05K 1/0201 174/266 |
| 2006/0099801 A1 * | 5/2006 | Cranmer | ................ | H05K 1/115 438/637 |
| 2011/0104867 A1 * | 5/2011 | Feustel | ............. | H01L 21/76813 438/424 |
| 2012/0080797 A1 * | 4/2012 | Daubenspeck | ......... | H01L 24/05 257/762 |
| 2018/0342460 A1 * | 11/2018 | Gudala | ..................... | H02J 1/00 |

* cited by examiner

*Primary Examiner* — Douglas M Menz
(74) *Attorney, Agent, or Firm* — Merchant & Gould P.C.

(57) ABSTRACT

A method of designing an integrated circuit device includes receiving an initial design of an integrated circuit, including a selection and location of a functional group of integrated circuit components, a power grid with multiple layers of conductive lines for supplying power to the components, and vias of one or more initial sizes interconnecting the conductive lines of different layers. The method further includes determining, based on a predetermined criterion such as the existence of unoccupied space for a functional unit, that a via modification can be made. The method further includes substituting the one or more of the via with a modified via of a larger cross-sectional area or a plurality of vias having a larger total cross-sectional area than the initial via. The method further includes confirming that the modified design complies with a predetermined set of design rules.

23 Claims, 8 Drawing Sheets

VIA SIZING FOR IR DROP REDUCTION

CROSS REFERENCE TO RELATED APPLICATION

This application is a divisional application of U.S. patent application Ser. No. 15/825,363, filed Nov. 29, 2017, the disclosure of which is hereby incorporated herein by reference.

BACKGROUND

This disclosure relates generally to integrated circuit (IC) design and manufacture and more specifically relates to IC products and methods with improved performance and reliability.

Integrated circuits include multiple, sometimes hundreds or thousands of, electronic components, such as transistors. Power to these electronic components is provided by one or a small number of power sources, such as voltage sources, and distributed to the various parts inside the IC through conductive layers and inter-layer connections, such as vias. The paths of power distribution introduces a power loss or voltage drop, sometimes referred to as an "IR drop," which reduces the voltages (in some contexts referred to as "rail voltage," "$V_{SS}$" or "$V_{DD}$") available to the electrical components. Such loss has adverse impacts on IC performance and power efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
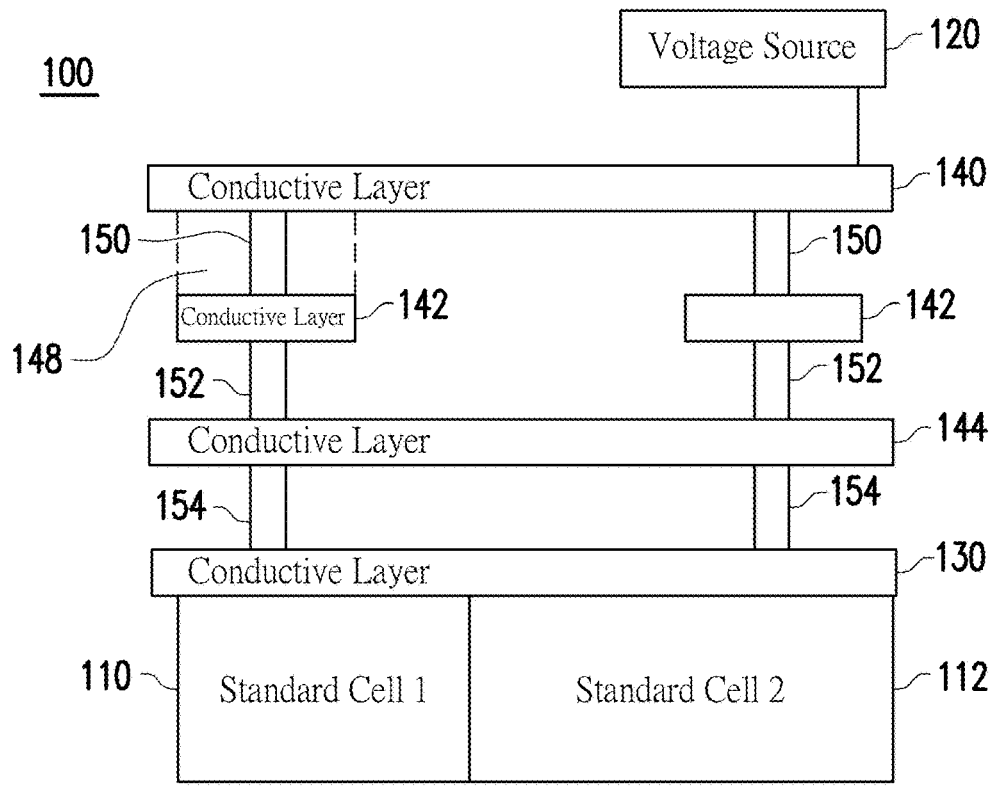
FIG. 1(a) shows a schematic side view of an example of a power distribution system an integrated circuit device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits include multiple, sometimes hundreds or thousands of, electronic components, such as transistors. Power to these electronic components is provided by one or a small number of power sources, such as voltage sources, and distributed to the various parts inside the IC through conductive layers and inter-layer connections, such as vias. The paths of power distribution introduce a power loss or voltage drop, sometimes referred to as an "IR drop," which reduces the voltages (in some contexts referred to as "rail voltage," "$V_{SS}$" or "$V_{DD}$") available to the electrical components. Such loss has adverse impact on IC performance and power efficiency. Certain example embodiments disclosed herein improve IC performance and efficiency by augmenting overall cross-sectional area of conductive paths from the power sources to the functional units (such as logic gates and memory elements), thereby reducing IR drop.

Portions of an IC device 100 according to some embodiments are schematically shown in FIG. 1(a). The IC device 100 includes functional units 110, 112, which in this example are logical functional units, sometimes referred to as "standard cells" in certain methodology of IC design. The power for operating these units is supplied from a power source, such as a voltage source 120, which in this example is intended to supply a rail voltage $V_{DD}$ at rail 130 to the standard cells 110,112. The power from the voltage source 120 is distributed throughout the IC device 100 through conductive layers 140,142,144,130, as well as inter-layer conductive paths, such as vias 150,152,154. The space between conductive layers is filled with an insulating material 146, such as silicon dioxide or organic insulator materials. Other insulating materials suitable for integrated circuits can also be used. In some embodiments, the conductive layers and vias are made of a metal, but other suitable conductive materials, such as polycrystalline silicon, can be used.

In the above example, as explained in more detail, some of the vias 150,152,154 can be of a larger size (i.e., having larger cross-sectional areas) than others. Each of the vias 150,152,154 in FIG. 1 can represent a single via or an array of two or more vias. Larger vias or more numerous vias having a larger overall via size reduce the resistance through the via or vias, thereby reducing IR drop.

Figure 1B:
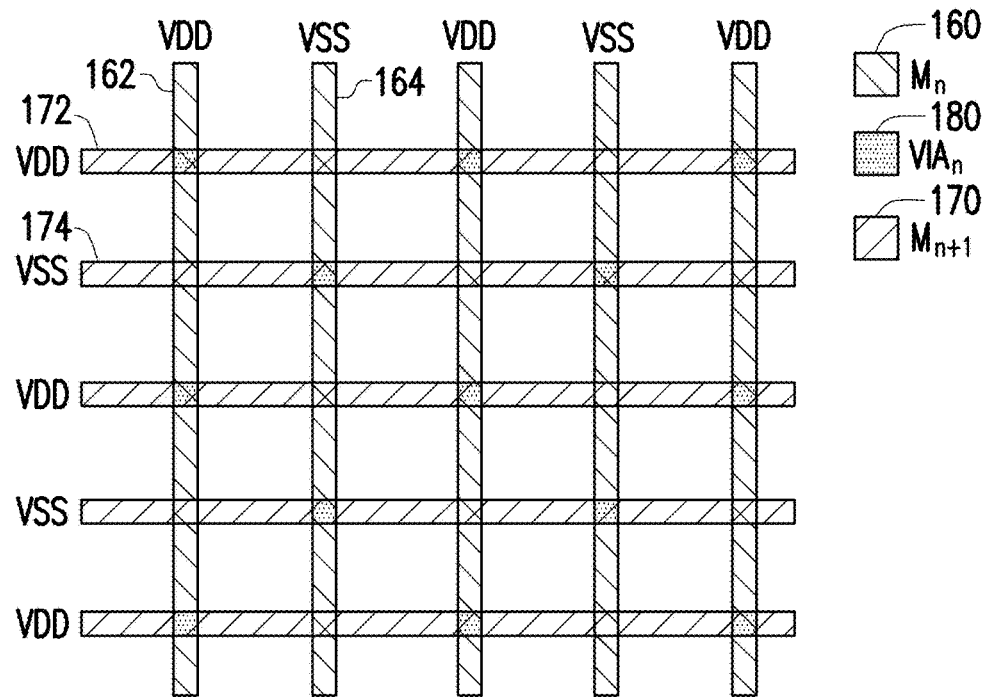
FIG. 1(b) shows a schematic plan view of an example of a power distribution system an integrated circuit device in accordance with some embodiments.

A plan view of two neighboring conductive layers (e.g., 140 and 142 in FIG. 1(a)) is shown schematically in FIG. 1(b). Here, the nth conductive layer 160 includes a group of parallel conductive lines 162,164; the (n+1)th conductive layer 170 includes a group of parallel conductive lines 172,174 oriented transverse to the parallel conductive lines 162,164. The parallel conductive lines 162,164 overlap parallel conductive lines 172,174 across the insulating regions 148 of the insulating material 146, and vias 180 corresponding to the nth conductive layer 160 are embedded in the insulating overlapped region 148.

In this example, alternate conductive lines 162 in the nth conductive layer 160 and alternate conductive lines 172 in the (n+1)th conductive layer 170 are interconnected by a subgroup of the vias 180. The conductive lines 162 and 172 thus form a grid of one voltage supply (e.g., $V_{DD}$). Likewise, alternate conductive lines 164 in the nth conductive layer 160 and alternate conductive lines 174 in the (n+1)st conductive layer 170 are interconnected by another subgroup of the vias 180. The conductive lines 164 and 174 thus form another grid of one voltage supply ($V_{SS}$).

Figure 2:
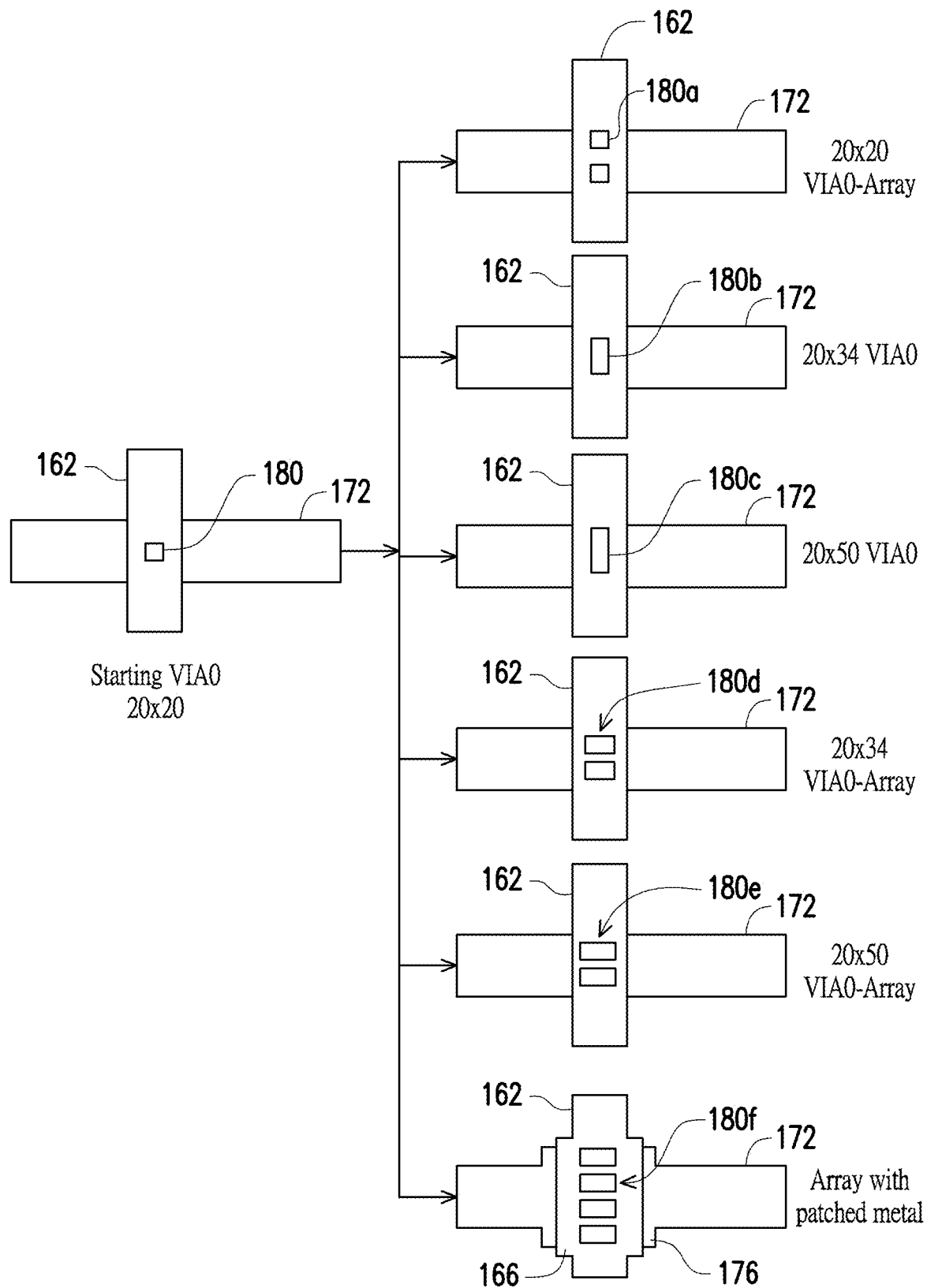
FIG. 2 schematically shows examples of ways to substitute a via with one or more others in accordance with some embodiments.

According to some embodiments, as schematically illustrated in FIG. 2, in an initial design of the IC device, a via 180 of a starting geometry or size for connecting a conductive line 162 and another conductive line 172 is specified. In a further design stage, the via 180 can be substituted by one or more vias to increase the total cross-sectional areas of the via(s) enclosed in the insulating region 148, if such substitution is permitted by applicable design rules. For example, the starting via cross-section can be (lengths in μm) 20×20. The via can be replaced by, as shown in the examples in FIG. 2, a via array 180a of two vias of 20×20, a single via 180b of 20×34, a single via 180c of 20×50, a via array 180d of two vias of 20×34, or a via array 180e of two vias of 20×50. Vias of other sizes, as well as combinations of sizes, can be used for via replacement. In some embodiments, the vias are made of a metal, but other suitable conductive materials, such as polycrystalline silicon, can be used. As shown in a further example in FIG. 2, an even larger via array 180f, which would otherwise exceed the space defined by the insulating portion 148 between the conductive lines 162, 172, can be substituted for the initial via 180 if a conductive patch 166,176 is used to widen one or both of the conductive lines 162,172 at least near the location of the vias 180f to enlarge the region or overlap 148 to accommodate the vias 180f.

In accordance with some embodiments, some or all vias for each grid can be examined for possible substitution. Thus, the via layer 300 shown in FIG. 3(a) for a given conductive layer may have the initial vias 180. After some or all vias have been examined for substitution, some can be substituted by larger vias or more vias, or both, resulting in a via pattern 310 in the example shown in FIG. 3(b). For example, some of the vias 180 have been replaced by vias 180a, 180b and 180e previously shown in FIG. 2.

Figure 3A:
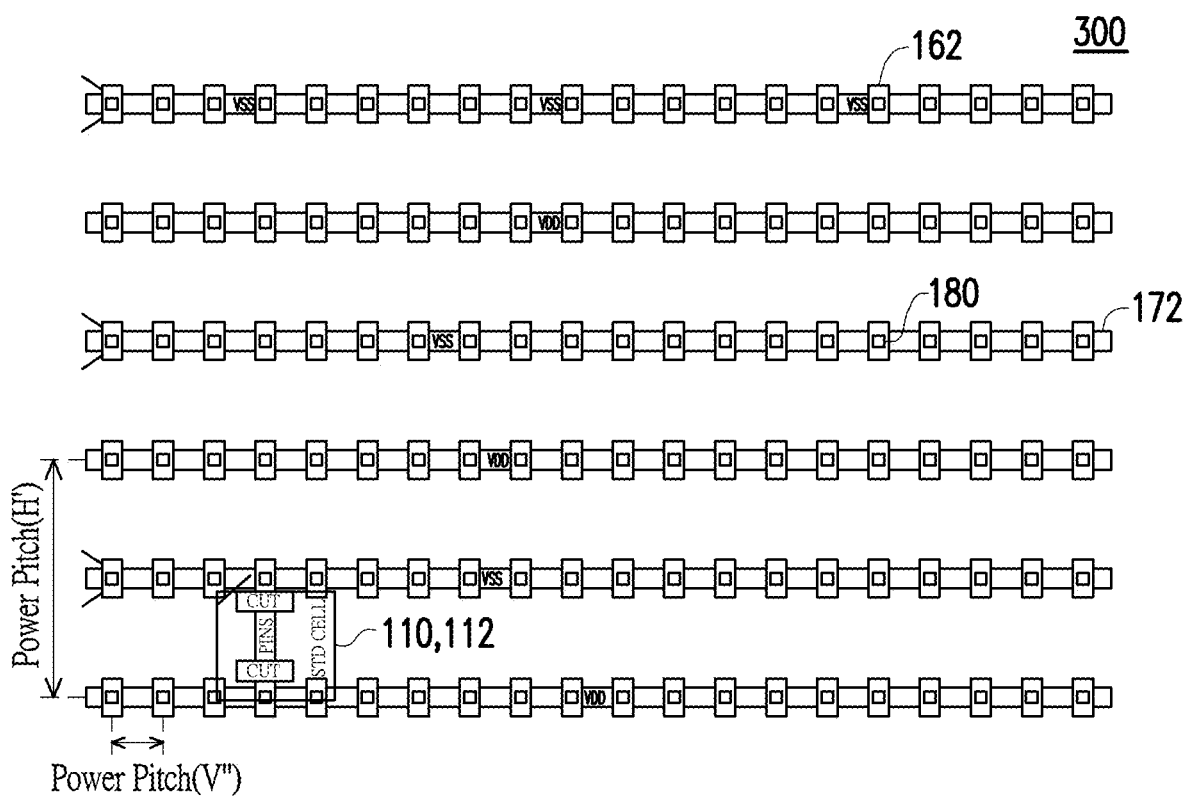
FIGS. 3(a) and 3(b) schematically show, respectively, via before and after substitution in accordance with some embodiments.
Figure 3B:
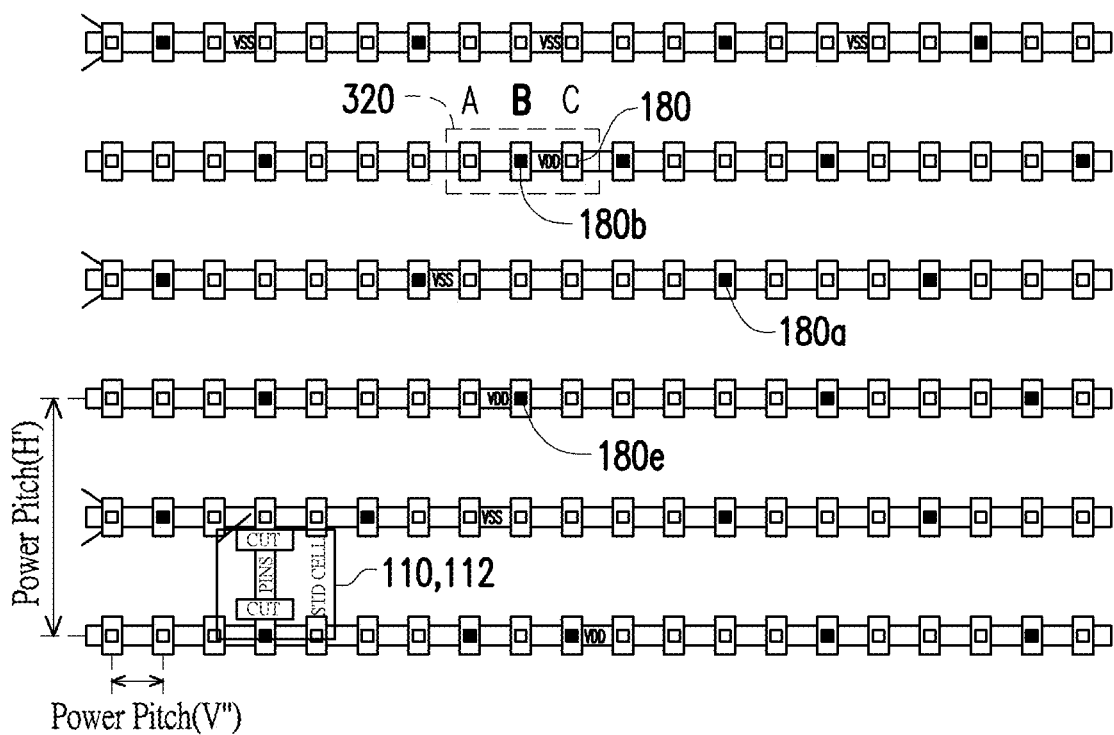
Figure 4:
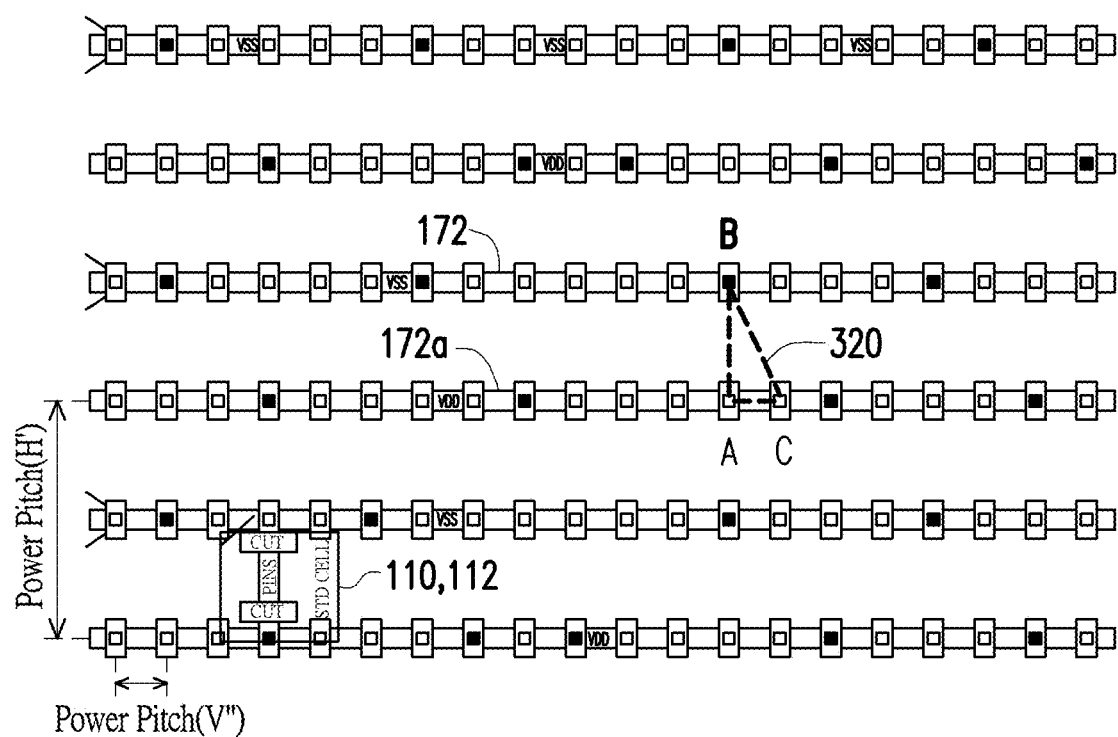
FIG. 4 schematically shows a pattern of via distribution after via substitution in accordance with some embodiments.

Also schematically shown in FIGS. 3(a) and 3(b), as well as in FIG. 4, are standard cells 110, 112, which are functional units (such as logic gates and memory elements), which in this example can be specified in a standard cell library. The conductive lines 162 and 172 are, in these examples, disposed in regularly spaced arrays. For example, the conductive lines 172, depicted as horizontal lines in FIGS. 3(a) and 3(b), and 4, are arranged to supply the rail voltages $V_{SS}$ and $V_{DD}$ in an alternating pattern, with a power pitch "H'," which is the spacing between two neighboring conductive lines of the same voltage supply, $V_{SS}$ or $V_{DD}$. Likewise, the conductive lines 162, depicted as vertical line segments, of "stubs," in the examples in FIGS. 3(b) and 3(c), and 4, are disposed in a periodic patter, with laterally neighboring stubs spaced apart by a power pitch "V".

The standard cells 110,112 each includes, in some examples, electrodes, sometimes referred to as "pins," for connecting to one or more signal lines to other parts, such as other standard cells, of the integrated circuit, in some cases through signal routing lines. In some cases, the location and/or layout of a standard cell are such that one or more pins are positioned to be connected to one or more power supply lines $V_{DD}$ and/or $V_{SS}$. In the examples shown in FIGS. 3(b) and 3(c), and 4, at least one of the pins is electrically connected to a stub 162 connected to the rail $V_{SS}$, and at least another one of the pins to the stub 162 connected to rail $V_{DD}$. In some embodiments, cuts are made to sever the connections between the pins and power supply lines in order to eliminate conflicts between signal lines and power supply lines. In some examples, such as those shown in FIGS. 3(b) and 3(c), and 4, cuts are made to both rails; in other examples, cuts to only one of $V_{SS}$ and $V_{DD}$ are made. With this stub-and-cut methodology, standard cells of a wide range of sizes can be placed freely in the grid.

Unsubstituted vias 180 and substituted vias (e.g., 180a-180f) can form certain patterns that can be useful in IC circuit design. For example, in FIG. 3(b), a substituted via (labeled "B") and two neighboring unsubstituted vias (labeled "A" and "C," respectively) along a conductive line 172 form a "sandwich" local pattern 320; in FIG. 4, a substituted via (labeled "B") in one conductive line 172 and two unsubstituted vias (labeled "A" and "C," respectively) along a neighboring conductive line 172a form a "triangle" pattern. Such patterns, or distributions of such patterns, may provide a basis for approval or rejection by design rules, or be used for analyzing the underlying standard cell structure, or be used for other purposes.

Figure 5:
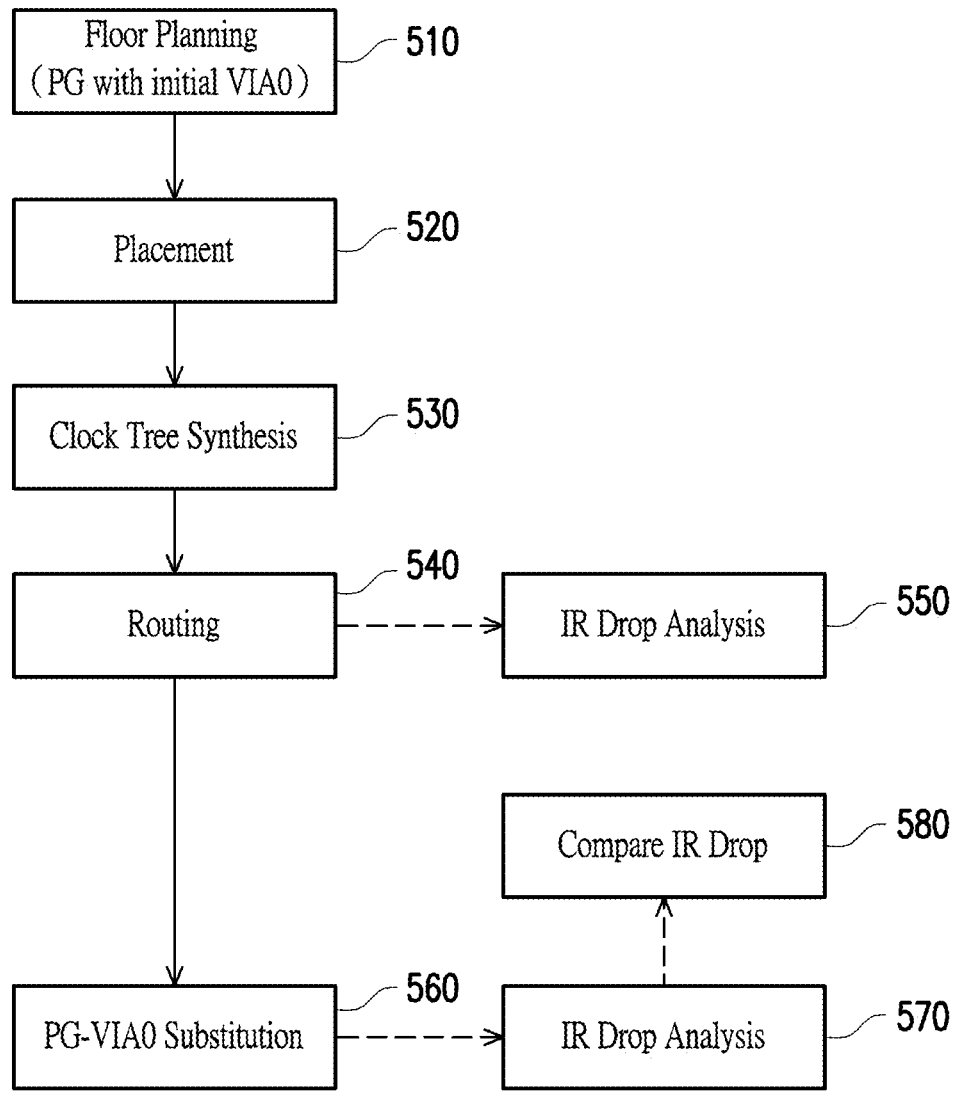
FIG. 5 outlines an example method of integrated circuit device design in accordance with some embodiments.
Figure 6:
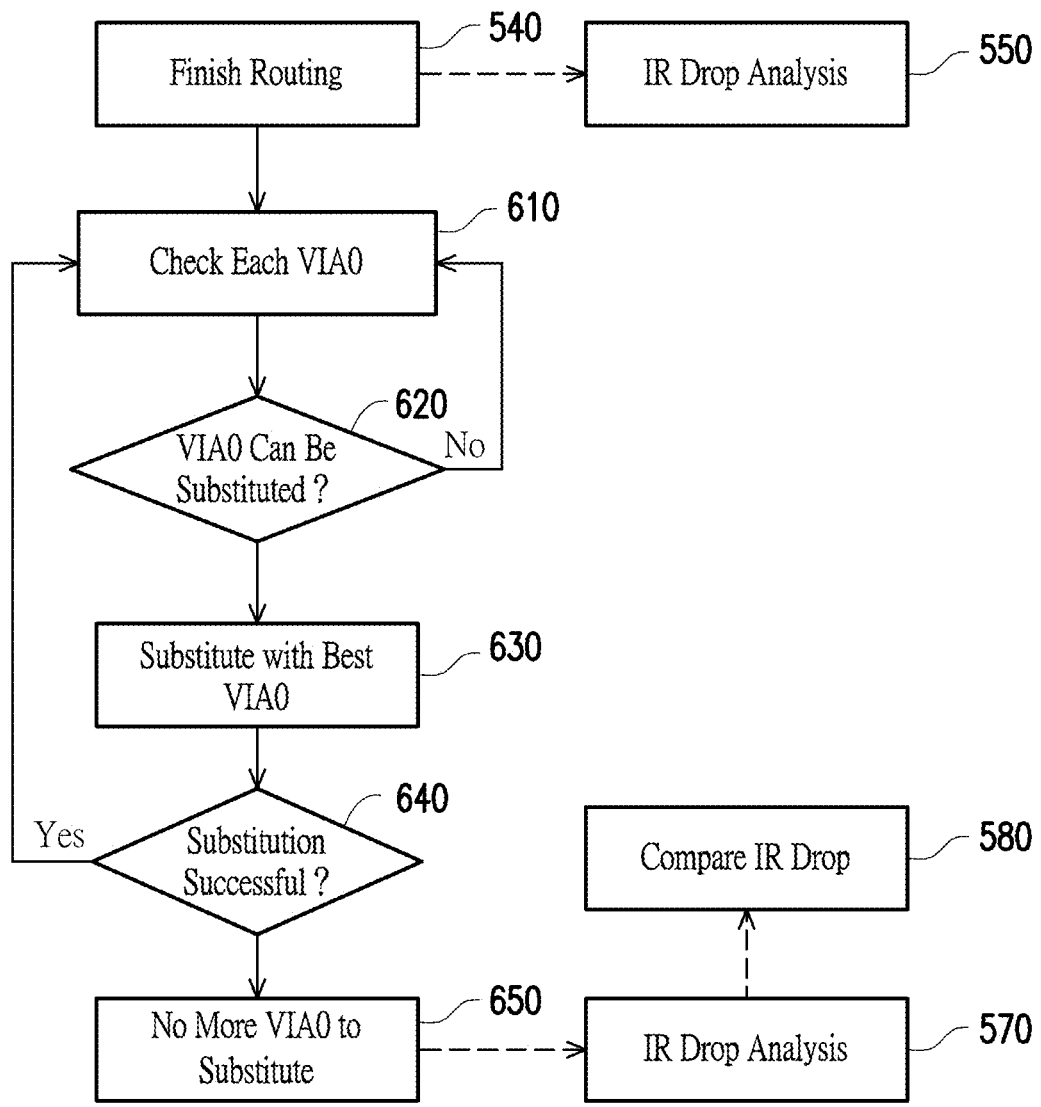
FIG. 6 outlines another example method of integrated circuit device design in accordance with some embodiments.
Figure 7:
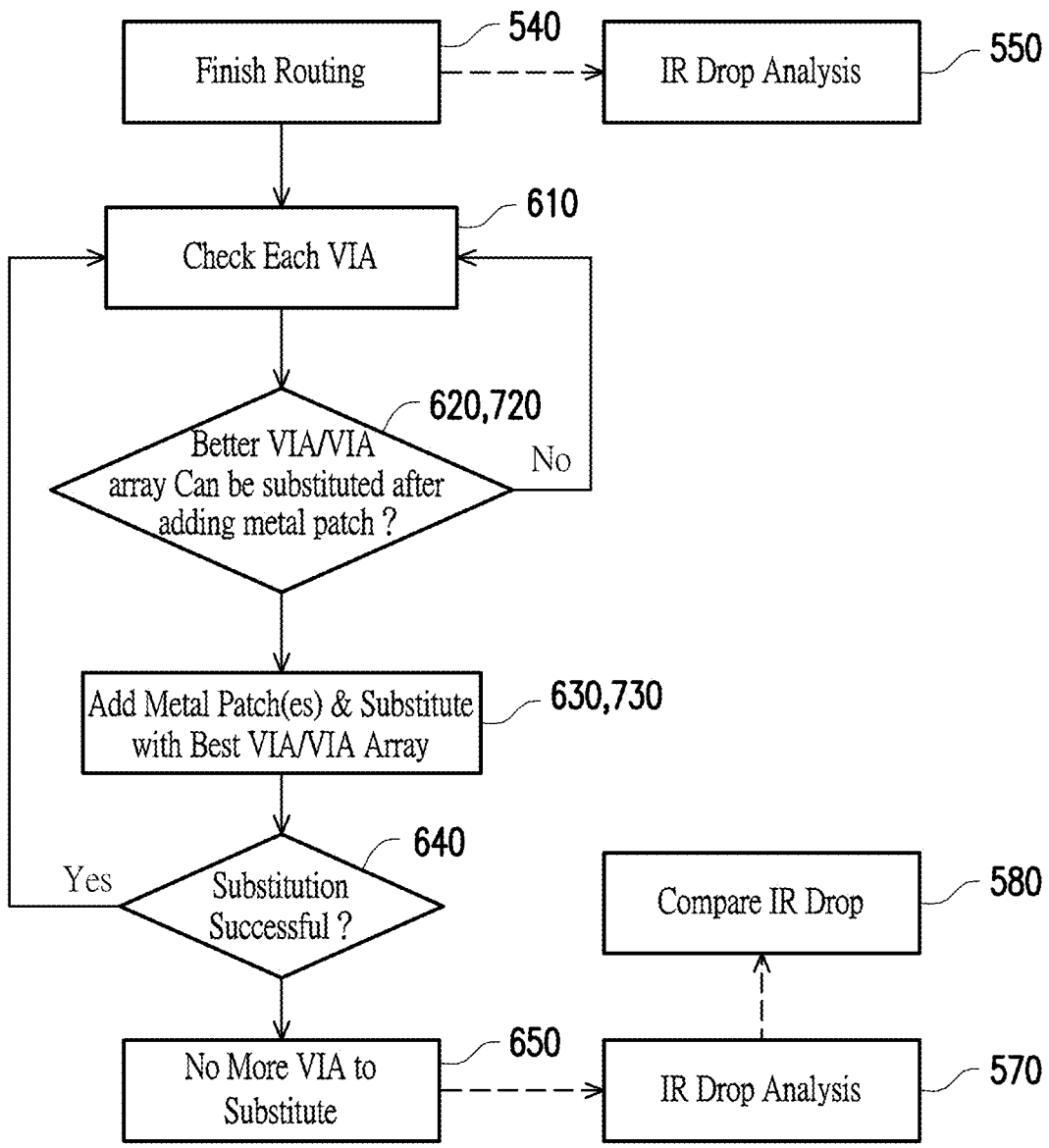
FIG. 7 outlines another example method of integrated circuit device design in accordance with some embodiments.
Figure 8:
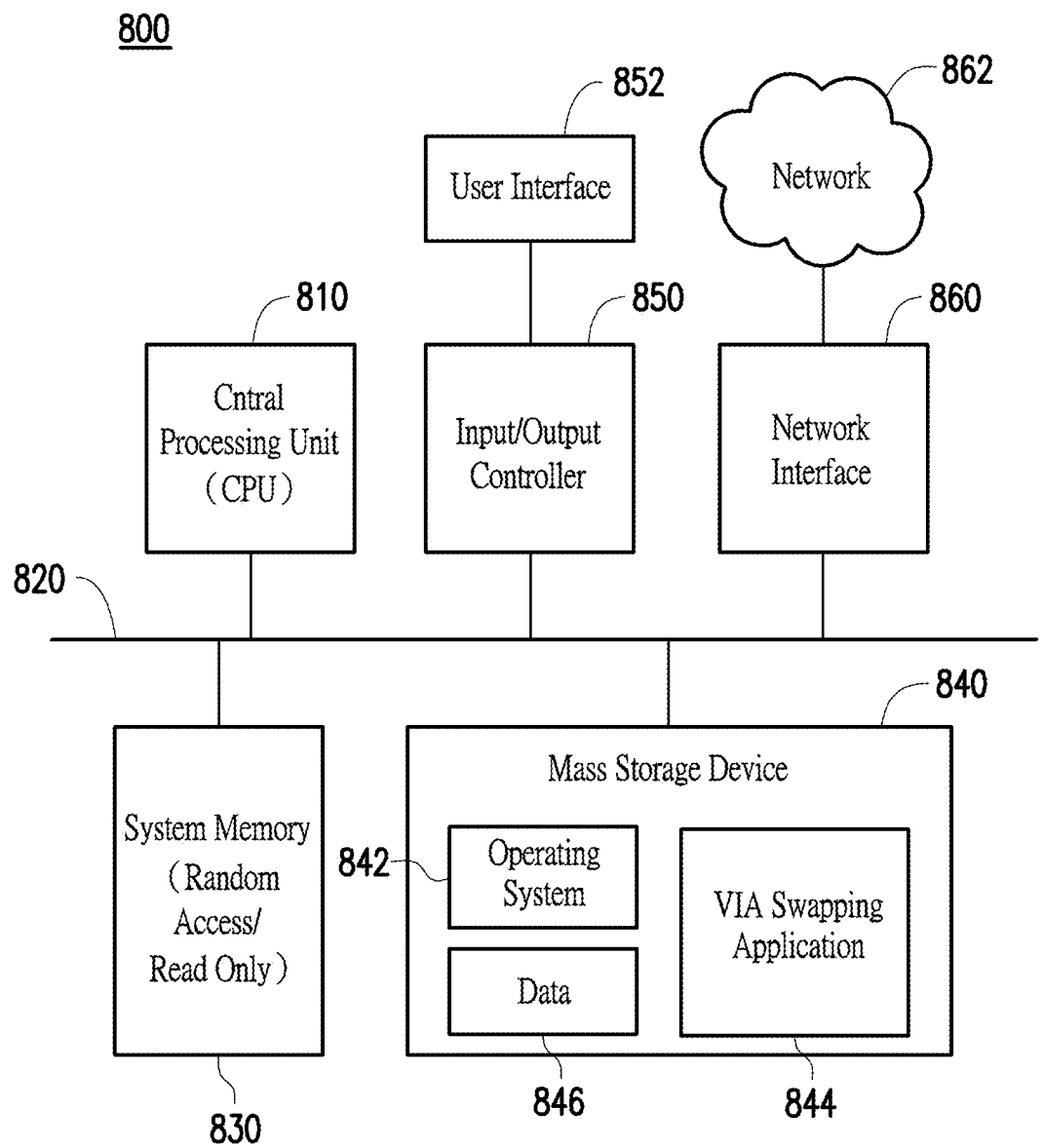
FIG. 8 schematically shows a computer for carrying out some method steps in accordance with some embodiments.

FIGS. 5-7 outline example methods for providing an initial design of an IC device and subsequent modification of the initial design to reduce IR drop as permitted by the design rules. The methods in these examples are performed by a special-purpose computer, such as the one depicted in FIG. 8 and explained in more detail below.

Once a modified design is deemed acceptable, further stages of fabricating the IC device according to the modified design are carried out.

Referring to FIG. 5, a method for designing an IC device includes Floor Planning 510, in which the logical description of the IC device is mapped to a physical description, including the arrangement of circuit blocks on a chip, the locations of the I/O pads, the locations and number of the power pads, the type of power distribution, and the locations and type of clock distribution. In particular, one or more power grids ("PGs") are designed, with the vias of the power grid(s) all having an initial size. In this example, design for a PG with initial size for the top layer of vias ("VIA0") is shown for the step 510, but the step can apply to any other layer ("VIAm," where m denotes the mth layer). Next, in the Placement stage 520, the locations of standard cells 110,112 are defined to particular positions in a row, with space set aside for interconnect to each logic/standard cell. Next, Clock Tree Synthesis 530 is performed to ensure that the clock signal for synchronizing data transfer gets distributed evenly to all sequential elements in the design. This stage includes inserting buffers or inverters along the clock paths as necessary to balance the circuit. Next, Routing 540 is performed. In this stage, interconnections among the standard cells are specified; the design is optimized to minimize the total interconnect length and minimize the critical path delay. In some embodiments, an IR Drop Analysis 550 is performed to predict the IR drop for the initial design; in some embodiments, this initial IR drop will be compared with the IR drop of one or more altered designs, to be described below. In some other embodiments, IR Drop Analysis 550 is not performed. A via substitution analysis 560 is then carried out, as will be described in more detail below. Again, while PG with initial size for the top layer of vias ("VIA0") is shown for the step 560, the step can apply to any other layer. Another IR Drop Analysis 570 can be performed, and the results can be compared 580 to the result of the IR Drop Analysis 550 before the via substitution analysis 560 to evaluate the effectiveness of the via substitutions in order to determine whether a proposed set of via substitutions are to be adopted.

The stages in an example via substitution analysis 560 are described in FIG. 6. Each via is analyzed (operation 610) to determine if certain criterion (criteria) are met for via substitution, and a decision is made (operation 620) as to whether the via under analysis can be substituted. An example criterion for via substitution is whether there are unoccupied standard cell sites at or near the via under analysis. For example, if there are no standard cells within one standard cell width or height from a via, or if the nature of the configurations of the standard cells surrounding a via is such that space is deemed available for a larger or more vias, the via can be a candidate for substitution with a larger or more vias. If a via cannot be substituted, the process goes back to operation 610 for the next via in the layer; if a via can be substituted, the design process continues to Substitution 630 to substitute the best via. In some embodiments, the via or vias that have largest total cross-sectional area without violating the applicable Design Rules are deemed to be the best. Other criteria, such as certain specific range of effective resistance, can also be used. In some embodiments, a discrete number of predetermined via sizes, and/or a discrete number of via arrays for each via size, are made available; the available via sizes and/or combinations provide a series of total cross-sectional areas. In operation 630, for example, the next available larger via configuration (whether a larger via or more vias, or both) can be proposed, and a Design Rule Check (DRC) is performed to assess whether such a substitution violates any design rules. In some embodiments, substitution of the initial via by progressively larger vias or via arrays is proposed (operation 640) until a violation of the Design Rules occurs. The largest via configuration without failing the DRC can then be adopted as the substitute via. The next via is then analyzed for possible substitution. The process repeats until all vias in the layer have been substituted to the extent possible (operation 650). In an alternative embodiment, not all of the vias are checked for substitution. In a further alternative embodiment, the vias or a subset of the vias in one or more additional layers in the power grid can be checked as described above.

The process outlined in FIG. 7 is nearly identical to the one in FIG. 6, except that in addition to examining the possibility of simple via substitutions, the process outlined in FIG. 7 assesses 720 whether a better substitution can be made by adding conductive patches 166 and/or 176 (see FIG. 2) to accommodate larger/more vias 180f. For example, combinations of conductive patches 166,176 of one or more predetermined sizes can be proposed, and one or more vias or via arrays of varying total cross-sectional area can be examined by Design Rule Check. If the proposed via or via array (e.g., 180f in FIG. 2) having the largest cross-sectional area, with the corresponding conductive patch, passes Design Rule Check, the combination of the via or via array with the conductive patch(es) is adopted 730. Every via is examined for this possibility and the process is repeated until all substitutions, with or without additional patching, have been made.

As briefly mentioned above, the processes described above are carried out by one or more special-purpose computer, which can be a general-purpose computer specifically programmed to perform the methods. For example, a computer 800 schematically shown in FIG. 8 can be used. The computer 800 includes a processor 810, which is connected to the other components of the computer via a bus 820. The components include system memory 830, which is loaded with the instructions for the processor 810 to perform the methods described above. Included is also a mass storage device such as magnetic, optical and solid-state discs, in which the operating system 842, VIA Substitution program 844, and Data 846 reside. Data 846 can include, for example, available via sizes/configurations, design rules, status of the IC circuit design, including the current via patterns. The computer 800 also includes an I/O controller 850, which controls a User Interface 852, which can include a keyboard, mouse, display and any other suitable user interfacing devices. The computer can further include a network interface 860 to enable the computer to receive and transmit data from and to remote networks 862.

Thus, the embodiments disclosed herein provide IC devices with improved IR Drop for enhanced performance and efficiency by increasing, where permissible by the design rules, the cross-sectional areas of the vias used in the power grid(s) in the IC device. The increased cross-sectional areas can be achieved by substituting a given via, in any layers, in an initial design with one or more vias with a greater total cross-sectional area. Increasing via cross-sectional area can be further accomplished by patching conductive lines with additional conductive material. The techniques disclosed in the specific embodiments and the principles underlying the specific embodiments also be used to improve other aspects of integrated circuit design. For example, via substitution can be used to optimize the resistance of one of more vias depending on specific performance requirements.

According to some embodiments, a method of making an integrated circuit device includes, providing an initial design of an integrated circuit device by providing locations of the conductive contacts in one conductive layer and a second layer of conductive contacts, locations and initial sizes of vias interconnecting contacts in the two layers, and standard cells and their locations. The method also includes deciding whether any of the vias can be substituted by a larger one (or more via) and if so, modify the initial design of the integrated circuit by making appropriate via substitution. The method further ensures that any via substitution complies with appropriate design rules. Finally, the method can further include fabricating the integrated circuit device according to the modified design.

According to some embodiments, a memory device stores a computer program that causes a computer to perform the method outlined above.

According to still further embodiments, an integrated circuit device includes two conductive layers, with overlapping portions interconnected by vias through an insulating region in a layer between the conductive layers. One of the conductive layers is connected to a voltage supply. Vias in some overlapping regions are larger than others, or an overlapping region can have an array of vias in place a single via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making an integrated circuit device, the method comprising:
    receiving a first design of an integrated circuit device by receiving locations of a first conductive contact portion in a first layer of conductive contacts and a second conductive contact portion in a second layer of conductive contacts, a location and first size of a first via for electrically interconnecting the first and second contact portions, and a selection and location of a functional group of integrated circuit components;
    determining, based on a predetermined criterion, that a modification of the first design can be made;
    modifying the first design of the integrated circuit by substituting the first via with a modified via of a larger cross-sectional area or a plurality of vias having a larger total cross-sectional area than the first via; and
    confirming that the modified design complies with a predetermined set of design rules.

2. The method of claim 1, wherein receiving the locations of the first and second conductive contact portions comprises receiving locations of a first plurality of conductive lines adapted to be connected to a common voltage source, and the locations of a second plurality of conductive lines, and wherein receiving the location of the first via comprises receiving a location where the first plurality of conductive lines and second plurality of conductive lines overlap.

3. The method of claim 1, wherein
    receiving the first size of the first via comprises receiving a first predetermined via geometry from a plurality of predetermined via geometries, and
    substituting the first via with a second via comprises selecting a second predetermined via geometry from a plurality of predetermined via geometries.

4. The method of claim 2, wherein modifying the first design further comprises increasing a width of at least one of the first and second plurality of conductive lines to accommodate the substitution of the first via by the modified via or plurality of vias.

5. The method of claim 2, wherein
    receiving the selection and location of a functional group of integrated circuit components comprises receiving an arrangement of a plurality of standard cells relative to the location of the first via, and
    determining that a modification of the first design can be made comprises determining that a predetermined condition exists in the arrangement of the plurality of standard cells relative to the location of the first via.

6. The method of claim 5, wherein determining that a predetermined condition exists in the arrangement of the plurality of standard cells relative to the location of the first via comprises determining that a site available for placement of a standard cell near the first via is not occupied by any standard cell.

7. The method of claim 1, further comprising determining a difference between a voltage at a voltage source and a voltage available to at least one of the functional groups in the modified design.

8. The method of claim 2, wherein providing a location and first size of a first via comprises determining that a first plurality of vias are to be located a respective plurality of locations where the first plurality of conductive lines and second plurality of conductive lines overlap,
    further comprising for each of the remainder of the first plurality of vias, determining, based on the predetermined criterion, whether to substitute the via with the modified via or plurality of vias.

9. The method of claim 1, further comprising fabricating the integrated circuit device according to the modified design.

10. The method of claim 1, wherein the modifying the first design of the integrated circuit includes substituting the first via with a plurality of vias spaced apart from each other and having a larger total cross-sectional area than the first via.

11. The method of claim 10, wherein receiving the locations of the first and second conductive contact portions comprises receiving locations of a first plurality of conductive lines adapted to be connected to a common voltage source, and the locations of a second plurality of conductive lines, and wherein receiving the location of the first via comprises receiving a location within a region where the first plurality of conductive lines and second plurality of conductive lines overlap.

12. The method of claim 11, wherein the modifying the first design further comprises increasing a width of at least one of the first and second plurality of conductive lines in the overlapping region to accommodate the substitution of the first via by the plurality of vias.

13. The method of claim 12, further comprising maintaining the width of the at least one of the first and second plurality of conductive lines in a portion outside the overlapping region.

14. The method of claim 11, wherein the receiving a first design of an integrated circuit device further comprising receiving information of an insulating layer interposed between the first and second layers of conductive contacts.

15. A method of designing an integrated circuit device, the method comprising:
    configuring a power grid, comprising:
        specifying locations of a first plurality of regularly-spaced conductive portions in a first layer, each of the first plurality of conductive portions being elongated substantially in a first direction and adapted to be connected to a first common voltage source; and
        specifying locations of a second plurality of regularly-spaced conductive portions in a second layer, each of the second plurality of conductive portions being elongated substantially in a second direction substantially transverse to the first direction;
    specifying an insulating layer interposed between the first and second layers,
        the first plurality of conductive portions overlapping the second plurality of conductive portions across a plurality of regions of the insulating layer; and
    specifying a plurality of via assemblies, each comprising one or more vias conductively interconnecting a respective pair of the mutually overlapping portions of the conductive portions of the first and second layers through the respective region of the insulating layer, such that the one or more vias in the via assembly in a first one of the plurality of regions of the insulating layer form a first via configuration, the one or more vias in the via assembly in a second one of the plurality of regions of the insulating layer form a second via configuration, the first via configuration has a larger total via cross-sectional area than the second via configuration, the first and second via configurations including different numbers of vias, at least one of the first and second ones of the plurality of regions of the insulating layer containing a plurality of conductive vias separated from each other by one or more portions of the insulating layer.

16. The method of claim 15, wherein the specifying a plurality of via assemblies comprises specifying that each via in the second one of the plurality of regions of the insulating layer has substantially the same cross-sectional area as each via in the second one of the plurality of regions of the insulating layer.

17. The method of claim 15, further comprising specifying a plurality of functional units adapted to receive power from the first voltage source through at least some of the conductive portions in the second layer.

18. The method of claim 17, wherein the first via configuration is prohibited for the second one of the plurality of regions of the insulating layer by a set of design rules for the integrated circuit device.

19. The method of claim 18, where the specifying each of the plurality of functional units comprising specifying a standard cell in a standard cell library for the integrated circuit device.

20. The method of claim 15, further comprising specifying a widths of the first and second pluralities of conductive portions such that the first plurality of conductive portions and the second plurality of conductive portions overlap over a greater area across the first region of the insulating layer than across the second region of the insulating layer.

21. A non-transient computer-readable medium storing instructions that, when executed by a computer, cause the computer to perform a method comprising:
receiving a first design of an integrated circuit device by receiving locations of a first conductive contact portion in a first layer of conductive contacts and a second conductive contact portion in a second layer of conductive contacts, a location and first size of a first via for electrically interconnecting the first and second contact portions, and a selection and location of a functional group of integrated circuit components;
determining, based on a predetermined criterion, that a modification of the first design can be made;
modifying the first design of the integrated circuit by substituting the first via with a modified via of a larger cross-sectional area or a plurality of vias having a larger total cross-sectional area than the first via; and
confirming that the modified design complies with a predetermined set of design rules.

22. The non-transient computer-readable medium of claim 21, wherein receiving the locations of the first and second conductive contact portions comprises receiving locations of a first plurality of conductive lines adapted to be connected to a common voltage source, and the locations of a second plurality of conductive lines, and wherein receiving the location of the first via comprises receiving a location where the first plurality of conductive lines and second plurality of conductive lines overlap.

23. The computer-readable medium of claim 22, wherein modifying the first design further comprises increasing a width of at least one of the first and second plurality of conductive lines to accommodate the substitution of the first via by the modified via or plurality of vias.

* * * * *